United States Patent
Belady et al.

(10) Patent No.: US 7,289,328 B2
(45) Date of Patent: Oct. 30, 2007

(54) MULTI-CHIP MODULE WITH POWER SYSTEM AND PASS-THRU HOLES

(75) Inventors: Christian L. Belady, McKinney, TX (US); Gary W. Williams, Rowlett, TX (US); Shaun L. Harris, McKinney, TX (US); Steven A. Belson, Plano, TX (US); Eric C. Peterson, McKinney, TX (US); Stuart C. Haden, Lucas, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 474 days.

(21) Appl. No.: 11/021,500

(22) Filed: Dec. 21, 2004

(65) Prior Publication Data

US 2006/0133040 A1 Jun. 22, 2006

(51) Int. Cl.
*H05K 7/20* (2006.01)

(52) U.S. Cl. ............ 361/704; 257/707; 257/712; 361/710; 361/719

(58) Field of Classification Search .......... None
See application file for complete search history.

(56) References Cited

U.S. PATENT DOCUMENTS

| | | | |
|---|---|---|---|
| 5,641,944 A * | 6/1997 | Wieloch et al. | 174/252 |
| 5,801,924 A * | 9/1998 | Salmonson | 361/719 |
| 6,014,313 A * | 1/2000 | Hesselbom | 361/704 |
| 6,356,448 B1 * | 3/2002 | DiBene et al. | 361/721 |
| 6,771,507 B1 | 8/2004 | Belady et al. | |
| 6,807,061 B1 * | 10/2004 | Harris | 361/719 |
| 6,816,378 B1 | 11/2004 | Belady et al. | |
| 6,819,562 B2 | 11/2004 | Boudreaux et al. | |
| 6,900,987 B2 * | 5/2005 | Belady et al. | 361/719 |
| 7,072,185 B1 * | 7/2006 | Belady et al. | 361/704 |

OTHER PUBLICATIONS

David A. Klein, U.S. Appl. No. 10/800,837, filed Mar. 15, 2004, entitled "Multi-Processor Module".

* cited by examiner

*Primary Examiner*—Greg Thompson

(57) ABSTRACT

Embodiments include apparatus, methods, and systems having a multi-chip module with a power system and pass-thru holes. An exemplary electronic module includes a first portion having a first printed circuit board (PCB) with a memory and plural processors. A second portion has a power system and a thermal dissipation device. The thermal dissipation device has plural extensions, and the power system has plural pass-thru holes. The first portion electrically couples to the second portion to form the electronic module when the plural extensions extend through the plural pass-thru holes of the power system and through plural pass-thru holes of a second PCB disposed between the first and second portions.

19 Claims, 6 Drawing Sheets

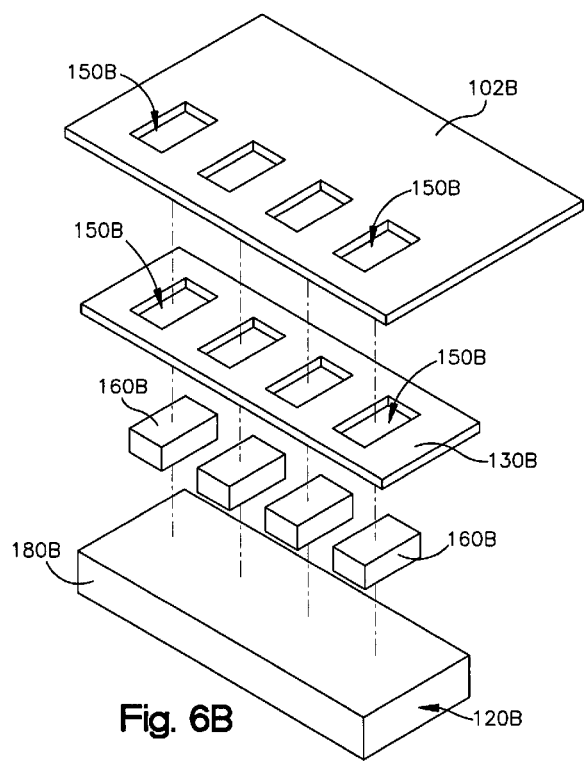
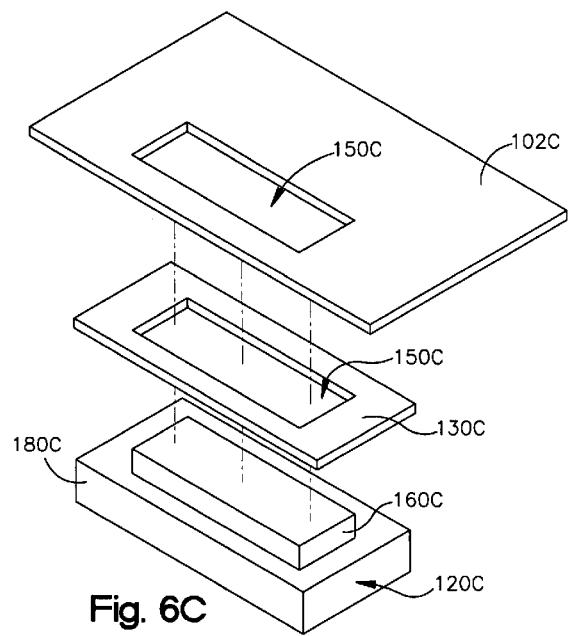
Fig. 6B
Fig. 6C

MULTI-CHIP MODULE WITH POWER SYSTEM AND PASS-THRU HOLES

BACKGROUND

Some electronic systems utilize several printed circuit boards with many different electronic components interconnected to the circuit boards. As these electronic systems decrease in size and increase in performance, packing density, heat dissipation, and power distribution architecture become increasingly important.

One way to increase packing density and reduce the actual size of an electronic device is to more closely position the electrical components together. Electrical components within a circuit board, however, are generally already tightly confined, and additional space may not be readily available. If, however, electrical components can be positioned to reduce the overall size of the electronic device, then significant savings and advantages can be realized.

As electrical components are more densely packed together and as performance of these components increases, heat dissipation can become a more significant factor in many electronic systems. Circuit boards may include a plurality of heat-generating devices that must be cooled in order to operate within a specified operating temperature. If these heat-generating devices are not sufficiently cooled, then the devices can exhibit a decrease in performance or even permanently fail. Further, if the heat-generating devices are closely packed together, then heat from one device could effect the performance of an adjacent device.

The design and layout of printed circuit board components can be quite complex and challenging. Designers must consider many factors, such as packing density and heat dissipation, to name a few examples. Improvements in these areas can realize significant benefits for electronic systems and devices.

SUMMARY

Embodiments include apparatus, methods, and systems having a multi-chip module with a power system and pass-thru holes. An exemplary electronic module includes a first portion having a first printed circuit board (PCB) with a memory and plural processors. A second portion has a power system and a thermal dissipation device. The thermal dissipation device has plural extensions, and the power system has plural pass-thru holes. The first portion electrically couples to the second portion to form the electronic module when the plural extensions extend through the plural pass-thru holes of the power system and through plural pass-thru holes of a second PCB disposed between the first and second portions.

In another exemplary embodiment, a method comprises connecting a memory and plural separate processors to a first circuit board; stacking a second circuit board between a power system board and the first circuit board; extending a portion of a thermal dissipation device through pass-thru holes in both the second circuit board and the power system board; and dissipating heat away from the power system board and away from the plural separate processors with the thermal dissipation device.

Other embodiments and variations of these embodiments are shown and taught in the accompanying drawings and detailed description.

BRIEF DESCRIPTION OF THE DRAWINGS

FIG. 6B is an exploded perspective view of another exemplary embodiment of a thermal dissipation device with a power system and PCB with pass-thru holes.

FIG. 6C is an exploded perspective view of another exemplary embodiment of a thermal dissipation device with a power system and PCB with pass-thru holes.

DETAILED DESCRIPTION

Figure 1:
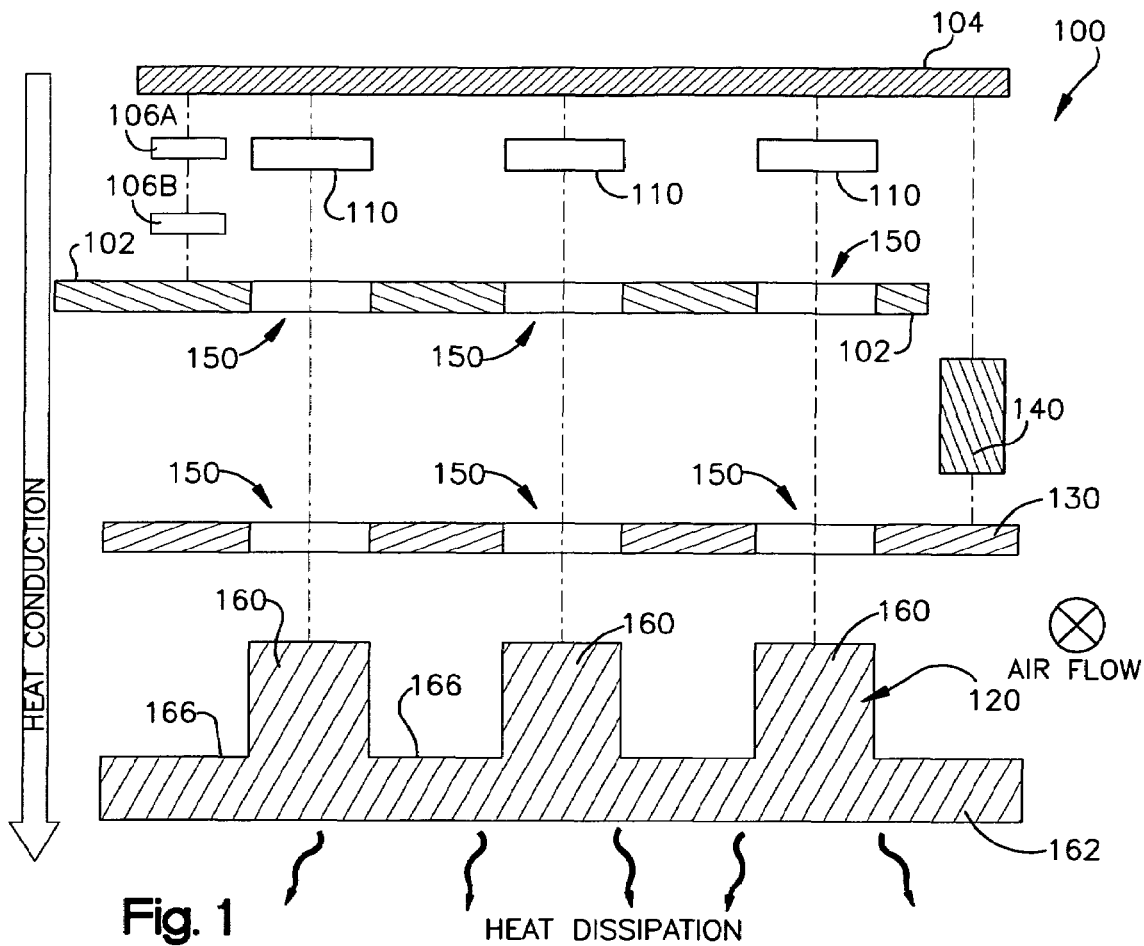
FIG. 1 is an exploded side view of a block diagram of an electronic assembly in accordance with an exemplary embodiment of the present invention.
Figure 2:
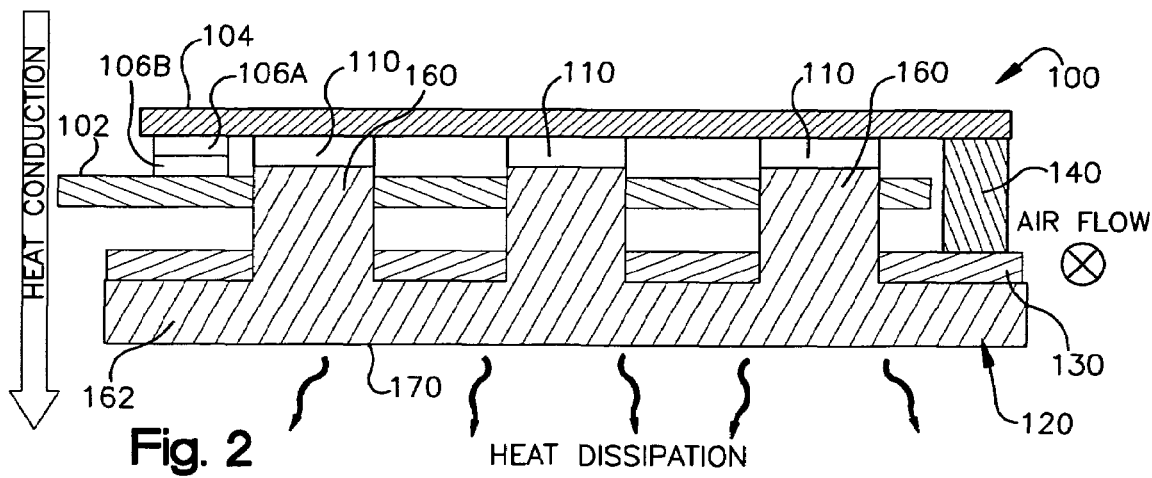
FIG. 2 is a side view of the electronic assembly of FIG. 1 with the electronic assembly being assembled together.
Figure 3:
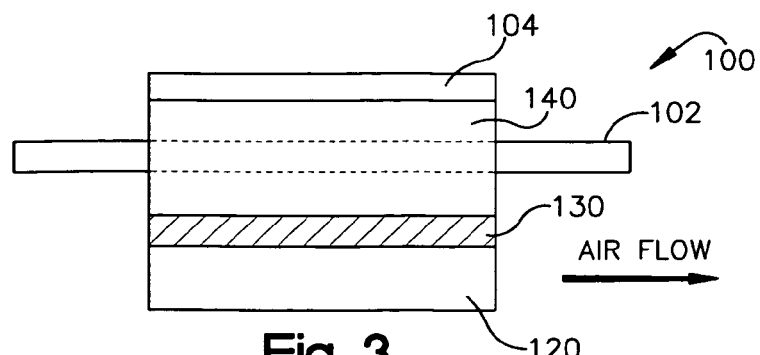
FIG. 3 is an end view of FIG. 2.

FIGS. 1–3 show an electronic system or assembly 100 in accordance with an exemplary embodiment of the present invention. The electronic assembly 100 includes two printed circuit boards (PCB) or printed wiring boards (PWB) 102 and 104. The PCBs 102 and 104 can have a variety of configurations and still be within embodiments in accordance with the invention. By way of example, the PCBs can include power module circuit boards, voltage regulation module (VRM) circuit boards, controller boards (such as a special type of expansion board that contains a controller for a peripheral device), expansion boards (such as any board that plugs into an expansion slot of a computer), or modules. As another example, the PCB 102 can be a motherboard, and the PCB 104 can be a daughterboard.

A motherboard is a printed circuit board that can be used in a personal computer, server, or other electronic device. The motherboard (also known as a main board or system board) can provide attachment points for processors, graphics cards, sound cards, controllers, memory, integrated circuits (ICs), modules, PCBs, and many other electronic components and devices in a computing system. The daughterboard can be utilized as an extension of the motherboard or other card or board. The daughterboard can have plugs, sockets, pins, connectors, or other attachments for the motherboard or other boards. Connectors 106A and 106B, for example, can be used to electrically couple the PCB 102 to the PCB 104. Connectors 106 provide a mechanical and electrical interface or connection between the PCBs and may include, for example, a removably connectable plug (male) and socket (female). Alternatively, a single connector can be used to connect the PCBs 102 and 104. Further, a connection mechanism between PCBs 102 and 104 can be located at various positions, such as, but not limited to, the sides and/or ends of the PCBs. Further yet, soldering can be used in place of or in conjunction with any connection.

The PCBs 102 and 104 include a plurality of electronic components or devices. For example, the PCB 104 includes a plurality of heat-generating components or devices 110. These heat-generating devices include any electronic component that generates heat during operation. For example, heat-generating devices include, but are not limited to, electronic power circuits, integrated circuits (ICs) or chips, digital memory chips, application specific integrated circuits (ASICs), processors (such as a central processing unit (CPU) or digital signal processor (DSP)), discrete electronic devices (such as field effect transistors (FETs)), other types of transistors, or devices that require heat to be thermally dissipated from the device for the device to operate properly or within a specified temperature range. An ASIC can comprise an integrated circuit or chip that has functionality customized for a particular purpose or application. The PCBs 102 and 104 and/or power system 130 can also include a plurality of electronic components or device that may or may not generate heat, that may generate low or insignificant amounts of heat, or that may generate heat but not require the generated heat to be thermally dissipated from the device for the device to operate properly or within a specified temperature range. Examples of such devices include, but are not limited to, resistors, capacitors, transistors, diodes, memories, etc.

The electronic assembly 100 includes at least one thermal solution or thermal dissipation device 120. Thermal dissipation devices include, but are not limited to, heat spreaders, cold plates or thermal-stiffener plates, refrigeration (evaporative cooling) plates, heat pipes, mechanical gap fillers (such as a plurality of rods, pins, etc.), thermal pads, or other devices adapted to dissipate heat. Further, thermal dissipation devices include thermal compounds and thermal interface material that can be used to form a thermally conductive layer on a substrate, between electronic components, or within a finished component. For example, thermally conductive resins, tapes, molded thermoplastic compounds, adhesives, gap pads, and greases can be used between a heat-generating device and thermal dissipating device to improve heat dissipation and/or heat transfer. Further, thermal dissipation devices include heatsinks. A heatsink is a component designed to reduce the temperature of a heat-generating device or component, such as heat-generating components 110. A heatsink, for example, can dissipate heat in a direct or indirect heat exchange with the electronic components, the heat being dissipated into surrounding air or surrounding environment. Numerous types of heatsinks can be utilized with embodiments in accordance with the present invention. For example, embodiments can include heatsinks without a fan (passive heatsinks) or heatsinks with a fan (active heatsink). Other examples of heatsinks include extruded heatsinks, folded fin heatsinks, cold-forged heatsinks, bonded/fabricated heatsinks, and skived fin heatsinks. Further, the thermal dissipation device, including heatsinks, can use liquids or phase change material. For example, the thermal dissipation device can conduct heat from heat generating devices to a heatsink that is liquid or air cooled. Furthermore, liquid pipes or liquid loops can be used to evacuate or transfer heat from the thermal dissipation device or module to an external location that is remote from the thermal dissipation device or module.

The electronic assembly 100 also includes at least one power supply or power system 130. Electrical connectors or power coupling devices 140 connect the respective power system 130 to the PCB 104. FIGS. 1–3 show one connector 140 located at an end or corner of the PCB 104 and/or power system 130. Although one connector 140 is shown, embodiments in accordance with the invention are not limited to a particular number or location of connectors. For example, multiple connectors can be used to couple the power system 130 to the PCB 104. Alternatively, the connectors can be located at various positions, such as, but not limited to, the sides, middle, and/or ends of the PCB 104 and/or power system 130. Further yet, such connectors can pass through a hole or opening in the PCB 102 to establish a connection between the PCB 104 and power system 130. Further, one or more connectors can be used to couple the PCB 102 to the power system 130.

The power system 130 can include numerous embodiments for providing power to electronic components (such as heat-generating components 110) and/or PCBs (such as the PCB 104) within the electronic assembly 100. For example, the power system can be a factorized power architecture (FPA) module, a power converter, such as a direct current (DC) converter or DC—DC converter, DC linear regulator, AC-DC converter, DC switching regulator, or DC charge pump.

The power system 130 can be configured as PCBs, power module assemblies, power circuit cards/boards, and/or power module PCBs. As shown in FIGS. 1–3, the power system 130 is disposed in a parallel and vertically stacked-up relationship with the thermal dissipation device 120 and PCBs 102 and 104.

The power system 130 and the PCB 102 include a plurality of pass-thru holes 150. Pass-thru holes are holes or openings that extend through something (example, the power system 130 or PCB 102). Each pass-thru hole 150 is adapted or shaped to receive a portion of the thermal dissipation device 120 such that the portion extends through the hole or opening.

As best shown in FIGS. 1 and 2, the thermal dissipation device 120 includes plurality of extensions or protrusions 160 that extends outwardly from a body or base 162 of the thermal dissipation device 120. The extensions 160 are adapted and shaped to fit through corresponding pass-thru holes 150 of both the power system 130 and PCB 102 and contact, abut, or come in close proximity with a top outer surface of heat-generating devices 110.

By way of illustration, the power system 130 and PCB 102 each include plural separate pass-thru holes 150. When the power system 130 and PCB 102 are in a vertically stacked configuration (example, one being above or below the other), the pass-thru holes in the power system 130 align with the pass-thru holes in the PCB 102. In other words, the pass-thru holes in the power system 130 are concentric (i.e., have a common center or axis) with the pass-thru holes in the PCB 102. In this vertically stacked configuration, the plural extensions 160 pass through the pass-thru holes 150 of both the power system 130 and the PCB 102 to reach or contact the top surface of the heat-generating components 110.

The power system 130 may be modular and replaceable. In some embodiments, the power system 130 is an independently-operable unit or module that can be constructed with standardized units or dimensions for flexibility and replaceability for use in the electronic assembly 100. Further, the power system 130 can be connected to or removed from the electronic assembly (example, the PCB 104) without connecting, removing, or replacing other components in the electronic assembly 100 (example, the heat-generating components 110). As such, the power system 130 can be serviced (example, replaced or repaired) independently of the PCB 102 or the PCB 104 and/or heat generating components 110. By way of illustration, suppose for example that power system 130 fails or otherwise needs replaced or upgraded. The power system 130 can be disconnected and removed from the PCB 104 without removing or replacing the heat-generating components 110 and/or the PCBs 102 and 104. The thermal dissipation device 120 could be simultaneously removed with the power system 130. Alternatively, the thermal dissipation device 120 could be first separately removed from the power system 130 and then the power system removed or disconnected from the PCB 104.

The PCB 104 may be modular and replaceable. In some embodiments, the PCB 104 is an independently-operable unit or module that can be constructed with standardized units or dimensions for flexibility and replaceability for use in the electronic assembly 100. Further, the PCB 104 can be connected to or removed from the electronic assembly (example, the PCB 102 and/or power system 130) without connecting, removing, or replacing other components in the electronic assembly 100 (example, the power system 130). As such, the PCB 104 can be serviced (example, replaced or repaired) independently of the PCB 102 or the power system 130 and/or thermal dissipation device 120. By way of illustration, suppose for example that the PCB 104 fails or otherwise needs replaced or upgraded. The PCB 104 can be disconnected and removed from the PCB 102 and/or power system 130 while the power system 130 and thermal dissipation device 120 remain connected to the PCB 102. Once the PCB 104 is removed, heat-generating components 110 could, for example, be repaired or replaced, and the PCB 104 then re-attached or re-connected to the PCB 102 and the power system 130.

Once connected, the PCB 102 is sandwiched between the PCB 104 and the power system 130. Further, the PCBs 102 and 104 and power system 130 are spaced apart, parallel, and mechanically and electrically connected to form a vertical stacked-up configuration. As shown in FIGS. 1–3, the electronic assembly 100 comprises at least three different vertically stacked layers, with each layer being separated from the other layers. A first or top layer includes the PCB 104; a second or middle layer includes the PCB 102; and a third or bottom layer includes the power system 130. The thermal dissipation device 120 is disposed or adjacent the third layer. In one exemplary embodiment, the thermal dissipation device 120 substantially fills a volume of space that extends above a top surface of the heat-generating components 110. As shown for example in FIGS. 1 and 2, a portion of the top side 166 of the thermal dissipation device 120 extends along all of or substantially all of the surface area (length×width) of an underside 168 of the power system 130.

Although FIGS. 1–3 illustrate the PCB 104, power system 130, and thermal dissipation device 120 as being one-piece, embodiments in accordance with the invention are not limited to being one-piece, integrally formed, or the like. The PCB 104, power system 130, and thermal dissipation device can be formed as separate, distinct units or pieces that, for example, couple together or that electrically and/or mechanically communicate with each other.

The thermal dissipation device 120 can directly or indirectly attach or contact various layers and/or electrical components (such as the power system 130, the heat-generating components 110, and/or PCBs 102 and 104). For example, the thermal dissipation device 120 can directly contact the power system 130 so as to directly transfer or dissipate heat away from the power system. Further, the thermal dissipation device 120 can directly contact the heat-generating components 110 so as to directly transfer or dissipate heat away from the heat-generating components.

Heat can be conducted or exchanged through plural layers and/or plural modules. This heat can be evacuated or dissipated from a common exit location or common surface area. For example, as shown in FIGS. 1 and 2, heat generated by the heat-generating components 110 can be vertically conducted or transferred through the pass-thru holes 150 of both the PCB 102 and power system 130 and thereafter dissipated into the air or environment at a top surface of the electronic assembly. For instance, as heat is generated from heat-generating components 110, the generated heat is transferred from a top surface of the heat-generating components 110 to extensions 160 of thermal dissipation device 120. This heat travels through the extensions 160, into the body 162, and exits a surface 170 of thermal dissipation device 120. In this manner, heat is transferred from one end or side of the electronic assembly 100 to another end or side of the electronic assembly.

The surface 170 of the thermal dissipation device 120 can be enhanced to facilitate heat dissipate and/or heat exchange. For example, the surface 170 can include fins, rods, pins, or other features. Further yet, the surface 170 or any other surface of a thermal dissipation device can be formed as a separate body or unit that mounts to the body 162 of the thermal dissipation device 120.

Although FIGS. 1 and 2 illustrate heat conduction or direct heat exchange to dissipate heat (example, heat being transferred from the heat-generating components 110, vertically through the PCB 102 and power system 130, and exiting through a surface of the thermal dissipation device), heat can be dissipated in other ways as well. For example, the thermal dissipation device 120 can be an active device that produces an airflow. For purposes of illustration only, the electronic assembly 100 is shown with an airflow direction as indicated with arrows in FIGS. 1–3 (the airflow being into the page and indicated with a circle and "X" in FIGS. 1 and 2). The airflow can be provided, for example, with a fan or other device positioned within the electronic assembly 100 or within or proximate the thermal dissipation device 120. For example, the airflow can be generated from a system fan. The airflow is directed in a pathway that is parallel to the PCBs 102 and 104 and power systems 130. A primary airflow can thus be directed at, above, or below the PCBs 102 and 104, the heat-generating components 110, the power system 130, and/or the thermal dissipation device 120. Airflow, however, is not limited to any particular direction. In some embodiments, for example, the airflow can be directed in a perpendicular direction with respect to the PCB 102, PCB 104, power system 130, and/or heat-generating components 110. Further, the primary airflow can be simultaneously directed to several different components/layers (such as the PCBs 102 and 104, the heat-generating components 110, the power system 130, and/or the thermal dissipation device 120) or exclusively at individual components/layers. Thus, the same airflow can be used to cool or dissipate heat simultaneously from multiple layers and/or components or solely from a single layer and/or component.

The airflow can be utilized to assist or augment heat dissipation. In this regard, the electronic assembly 100 can utilize one or both of heat conduction and/or an airflow pathway to dissipate heat. The combinations of heat conduction and airflow to dissipate heat are numerous. By way of illustration, the thermal dissipation device 120 can directly contact the heat-generating components 110 to conduct heat away from these components. At the same time, the thermal dissipation device could generate or be exposed to an airflow that is directed at both the PCB 102 and the thermal dissipation device 120. This airflow could be utilized to cool the PCB 102 and the thermal dissipation device 120 as the thermal dissipation device conducts and dissipates heat away from the heat-generating components 110. Thus, the same thermal dissipation device 120 simultaneously dissipates heat away from PCBs 102 and 104, heat-generating components 110, and power system 130.

Figure 4:
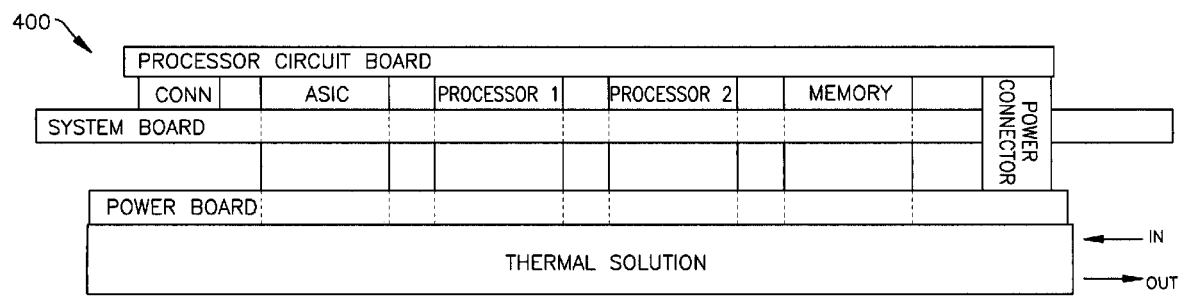
FIG. 4 is a side view of an exemplary embodiment of an electronic assembly being assembled together.
Figure 5:
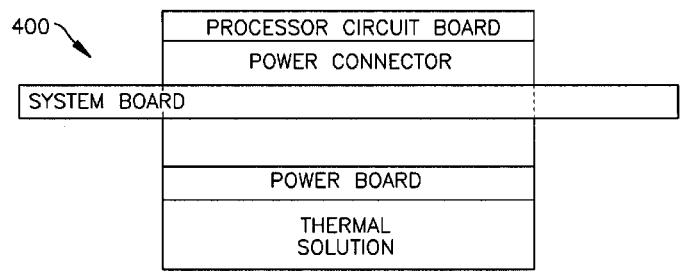
FIG. 5 is an end view of FIG. 4.

Various different electronic components, layers, and PCBs can be combined into different embodiments in accordance with the invention. FIGS. 4 and 5 illustrate one such exemplary embodiment as electronic assembly 400. In this figure, the processor circuit board can include (among other electrical components) processors, memories, and ASICs. For example, the processor circuit board can have numerous electronic heat-generating components, such as two processors, an ASIC, and memory, to name a few examples. The processor circuit board is coupled, via a connector, to a system board. The system board is sandwiched between a power board and the processor circuit board in a vertical stacked-up configuration. A thermal solution is positioned directly above one surface of the power board to dissipate heat away from the power board. The thermal solution has a plurality of feet or extensions that extend through pass-thru holes in both the system and power boards. These feet contact the processors, ASIC, and memory to conduct and dissipate heat, via direct heat exchange, from the processors, ASIC, and memory. A power connector extends through a pass-thru in the system board to connect the power board to the processor circuit board. The power board can include power controls that can, for example, provide power control functionality for the power board.

The thermal dissipation device can utilize a remote heat exchanger (RHE). An RHE enables the thermal dissipation device to be remote from the heat-generating device (such as PCB 104, heat-generating components 110, and/or power system 130). For example, heat can be transferred from the heat-generating device to an attachment block having a heat pipe. Further, the heat pipe can be integral to the module or any portion of the electronic system (example, the thermal dissipation device) and extend outwardly from the electronic system to a remote heatsink. Alternatively, the heat pipe can attach to a surface of the module or system (example a surface of a thermal dissipation device) and then extend to a remote heatsink. The heat pipe, for instance, can be a hollow copper pipe containing a fluid and wicking material. Through a process of vaporization and re-condensation, heat travels through the heat pipe to a heat exchanger, such as a finned heat sink. Localized airflow can be used to evacuate the heat to the environment.

Looking to FIGS. 4 and 5 as examples, the thermal solution could be a cold-plate and/or utilize heat dissipation via heat pipes or liquids. The "In" and "Out" arrows signify liquid-in and liquid-out, respectively. As such, the thermal solution can be coupled to a pump and/or a heat exchanger to circulate a cooling liquid through the thermal solution to cool any one or combination of PCBs, heat-generating components, power system, etc. The thermal solution discussed in connection with FIGS. 4 and 5 can be utilized in conjunction with one or both of the heat conduction and/or airflow cooling techniques discussed in connection with FIGS. 1–3. As one example, the thermal dissipation device 120 of FIGS. 1–3 can include a separate piece or unit on the top surface 170 (such as the thermal solution discussed in connection with FIGS. 4 and 5). This separate piece could be a liquid cold plate, evaporator, refrigerator, heatsink, or other device or technology known in the art. As such, the embodiments in FIGS. 4 and 5 can be utilized in conjunction with any embodiments discussed herein.

As best shown in FIGS. 1 and 2, thermal dissipation device 120 comprises a unitary or single member. Embodiments in accordance with the invention, though, can utilize a wide variety of types and number of thermal dissipation devices. For example, the thermal dissipation device 120 can comprise a plurality of individual, separate members. Some examples of various embodiments that can be utilized in conjunction with the electronic assembly 100 are shown in FIGS. 6A–6C.

Figure 6A:
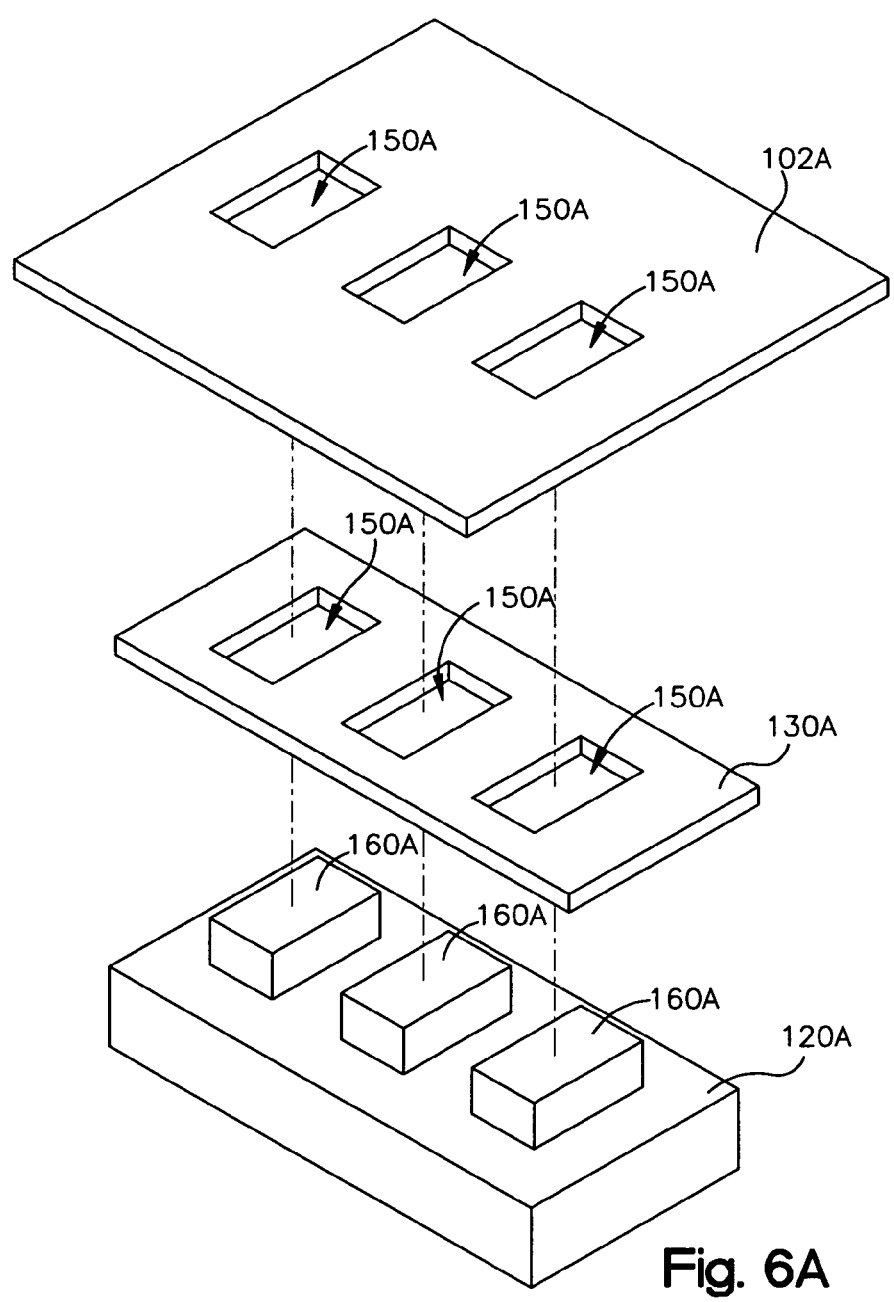
FIG. 6A is an exploded perspective view of a thermal dissipation device with a power system and PCB with pass-thru holes.

Turning to FIG. 6A, a power system 130A is sandwiched between a PCB 102A and a thermal dissipation device 120A. The PCB 102A and power system 130A each have plural (three shown) pass-thru holes 150A. The thermal dissipation device 120A has plural (three shown) extensions 160A. The pass-thru holes 150A are shaped and sized to receive the extensions 160A such that the extensions can pass through the power system 130A and PCB 102A to contact heat-generating components (shown in FIGS. 1–3). As shown, the number, size, and shape of the extensions 160A correspond to the number, size, and shape of pass-thru holes 150A. In one exemplary embodiment, one extension 160A and one corresponding pass-thru hole 150A can be provided for each heat-generating device (for example, each heat-generating device 110 on PCB 104 shown in FIGS. 1–3).

Turning to FIG. 6B, a power system 130B is sandwiched between a PCB 102B and a thermal dissipation device 120B. The PCB 102B and power system 130B each have plural (four shown) pass-thru holes 150B. The thermal dissipation device 120B has plural (four shown) extensions 160B. The extensions 160B are separate and removable from a body portion 180B of the thermal dissipation device 120B. The pass-thru holes 150B are shaped and sized to receive the extensions 160B such that the extensions can pass through the power system 130B and PCB 102B to contact heat-generating components (shown in FIGS. 1–3). As shown, the number, size, and shape of the extensions 160B correspond to the number, size, and shape of pass-thru holes 150B. In one exemplary embodiment, one extension 160B and one corresponding pass-thru hole 150B can be provided for each heat-generating device (for example, each heat-generating device 110 on PCB 104 shown in FIGS. 1–3).

Turning to FIG. 6C, a power system 130C is sandwiched between a PCB 102C and a thermal dissipation device 120C. The PCB 102C and power system 130C each have a single pass-thru hole 150C. The thermal dissipation device 120C has a single extension 160C. The extension 160C could be integral with a body portion 180C or separate and removable from the body portion 180C of the thermal dissipation device 120C. The pass-thru hole 150C is shaped and sized to receive the extension 160C such that the extension can pass through the power system 130C and PCB 102C to contact heat-generating components (shown in FIGS. 1–3). As shown, the number, size, and shape of the extension 160C correspond to the number, size, and shape of pass-thru holes 150C. In one exemplary embodiment, one extension 160C and one corresponding pass-thru hole 150C can be large enough to cover plural adjacent heat-generating devices (for example, plural heat-generating devices 110 on PCB 104 shown in FIGS. 1–3).

Embodiments in accordance with the present invention are not limited a specific location, number, size, or shape of pass-thru holes. For example, the pass-thru holes can be provided on a periphery or edge of a PCB or power system.

As discussed herein, the thermal dissipation device can comprise numerous different embodiments in accordance with the invention. FIGS. 7A to 7D illustrate further examples of thermal dissipation devices that can be utilized in conjunction with the electronic assembly 100. These examples illustrate a single airflow, but multiple airflows with various directions are within embodiments in accordance with the invention.

Figure 7A:
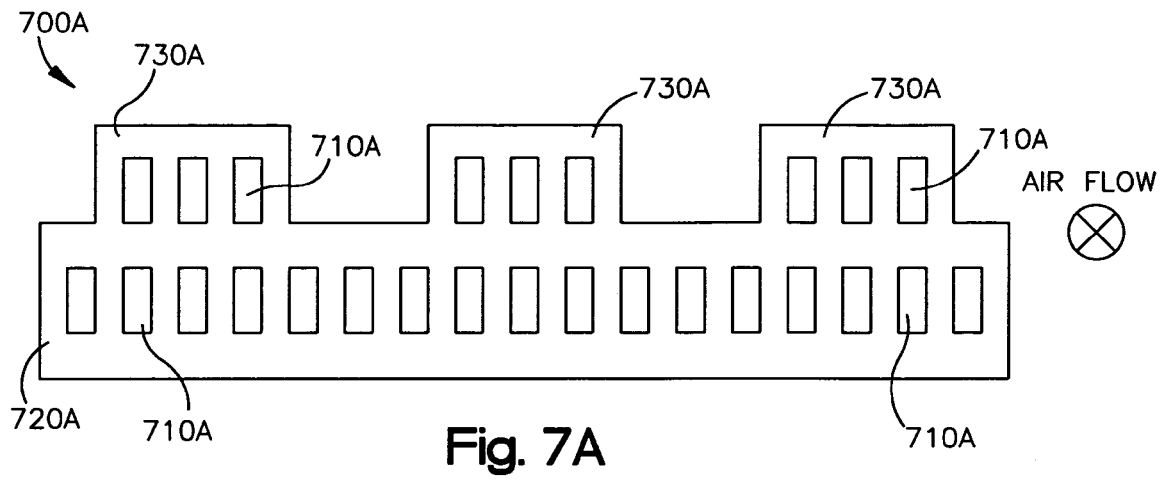
FIG. 7A is an exemplary embodiment of a thermal dissipation device.

FIG. 7A shows a thermal dissipation device 700A having a plurality of openings 710A. The openings 710A extend through both a base portion 720A and plural extensions 730A. Further, the openings 710A can have a variety of configurations and/or shapes and include slots, holes, etc. and can be formed from adjacent pins, rods, fins, etc. The openings 710A enable an airflow (the airflow being into the page and indicated with a circle and "X") to pass through the thermal dissipation device 700A.

Figure 7B:
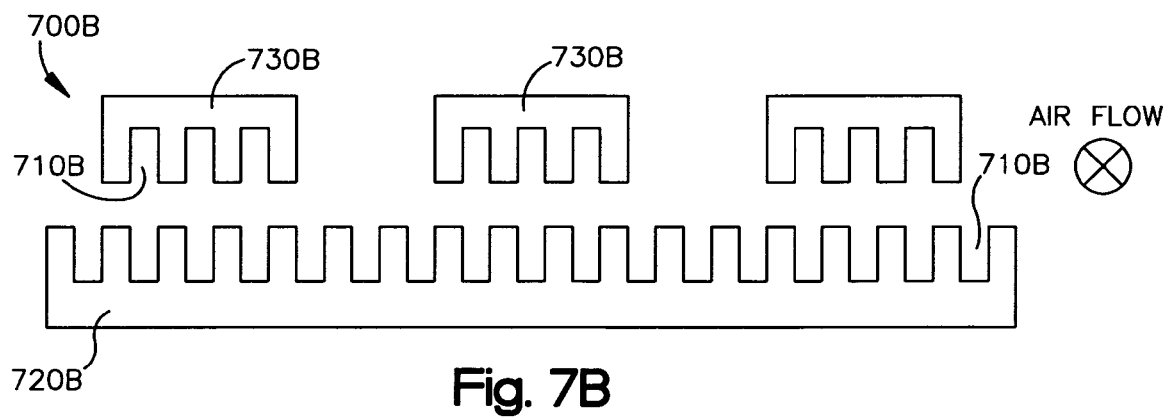
FIG. 7B is another exemplary embodiment of a thermal dissipation device.

FIG. 7B shows another example of a thermal dissipation device 700B having a plurality of openings 710B. The openings extend through both a base portion 720B and plural extensions 730B. As shown, the extensions 730B are separate and removable from the base portion 720B. Further, the openings 710B can have a variety of configurations and/or shapes and include slots, holes, etc. and can be formed from adjacent pins, rods, fins, etc. The openings 7101B enable an airflow (the airflow being into the page and indicated with a circle and "X") to pass through the thermal dissipation device 700B.

Figure 7C:
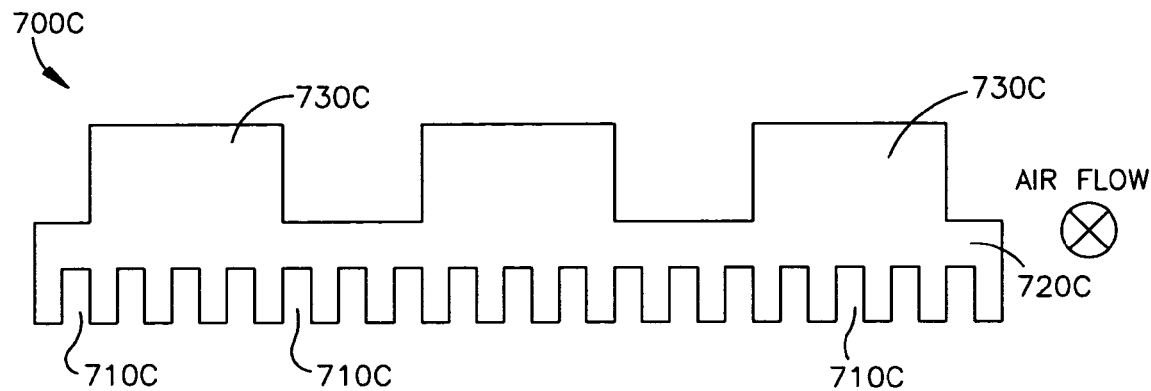
FIG. 7C is another exemplary embodiment of a thermal dissipation device.

FIG. 7C shows another example of a thermal dissipation device 700C having a plurality of openings 710C. Extensions 730C extend upwardly from a base portion 720C. Further, the openings 710C can have a variety of configurations and/or shapes and include slots, holes, etc. and can be formed from adjacent pins, rods, fins, etc. The openings 710C enable an airflow (the airflow being into the page and indicated with a circle and "X") to pass through the thermal dissipation device 700C.

Figure 7D:
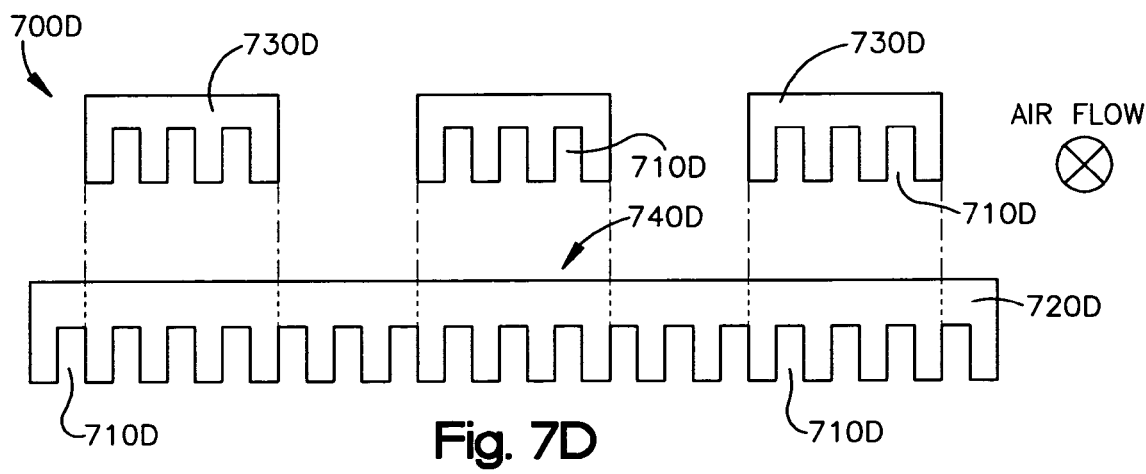
FIG. 7D is another exemplary embodiment of a thermal dissipation device.

FIG. 7D shows another example of a thermal dissipation device 700D having a plurality of openings 710D. Extensions 730D are separate and removable from a base portion 720D. These extensions 730D extend through holes or openings 740D in the base portion 720D. The openings 710D can have a variety of configurations and/or shapes and include slots, holes, etc. and can be formed from adjacent pins, rods, fins, etc. The openings 710D enable an airflow (the airflow being into the page and indicated with a circle and "X") to pass through the thermal dissipation device 700D.

Embodiments in accordance with the present invention can utilize a modular connective architecture. If a particular electronic component (including PCBs) or device fails or otherwise needs to be replaced, the electronic component can be removed from the module or the electronic assembly and replaced with a new and/or different component. As such, the electronic assemblies can be constructed with standardized electronic components and/or dimensions to enable flexibility and variety of use and exchange of components. Looking to FIGS. 4 and 5 as an example, if the thermal solution fails or needs to be replaced, the thermal solution can be disconnected and/or removed from the power board. Thereafter, a new and/or different thermal solution can be connected to the power board. As another example, if the power board fails or needs to be replaced, the power board can be disconnected or uncoupled from the power connector and removed from the electronic assembly 400 while the processor circuit board and system board remain mechanically connected. A new and/or different power circuit board can thereafter be connected to the power connector and utilized with the electronic assembly 400. As such, expensive heat-generating components (such as processors, memories, ASICs, etc.) can remain unchanged and do not need to be removed or replaced.

As used herein, the term "module" means a unit, package, or functional assembly of electronic components for use with other electronic assemblies or electronic components. A module may be an independently-operable unit that is part of a total or larger electronic structure or device. Further, the module may be independently connectable and independently removable from the total or larger electronic structure.

The configuration or arrangement of electronic components, layers, and/or modules shown in the figures saves weight, space, and costs since the components and/or layers are efficiently spaced and additional thermal dissipation devices are not required. For example, embodiments in accordance with the present invention can utilize a variety of modules. Looking to FIGS. 1–3, the PCB 104 can be a processor module that includes heat-generating components 110 (such as plural separate processors, an ASIC, and memory all on the same board or card). As another example, the power system 130 can form a power system module. The power system module can vertically stack and connect or coupled, via connector 140, to the PCB 104. The thermal dissipation device 120 can be disposed on one surface of the power system 130. Together, the power system module, connector, processor module, and thermal dissipation device form a processor/power module that can be removably connected to, for example, the PCB 102. FIGS. 2 and 3, for example, show such a processor/power module connected, via connectors 106A and 106B, to PCB 102. Further, the power system 130 can provide a power source that is proximally close to the load (example the PCB 104) in order to minimize noise and optimize step load performance.

Intone exemplary embodiment, the processor/power module can comprise two halves that mechanically and electrically connect or couple together. A first half includes the power system module. The power system module can include the power system 130 with or without the thermal dissipation device 120. A second half includes the processor module. The processor module includes the heat-generating components 110. In order to assemble the processor/power module, the first half (i.e., the power system module) is coupled or connected to a first side of the PCB 102. A second half (i.e., the processor module) is coupled or connected to a second side (opposite the first side) of the PCB 102. Various connectors can be used to couple the first and second halves to the PCB 102. As best shown in FIGS. 1–3, the PCB 102 is sandwiched between the processor/power module. Further, as shown, when the processor/power module is assembled, the heat-generating components 110 are positioned inside a housing of the module itself. This configuration increases packing density of the module.

The processor/power module can have various configurations. For illustration purposes (as shown in FIGS. 1–3), the processor/power module has a general rectangular configuration. A top surface is formed from one outer surface of the PCB 104, and a bottom surface is formed from one outer surface of the thermal dissipation device 120. The connector 140 forms one end of the module, while connectors 106A, 106B and an end portion of the thermal dissipation device 120 forms another end of the module.

In order to facilitate modularity within the electronic assembly, various removable connections between electronic components can be utilized. By way of example, such connections include, but are not limited to, land grid arrays (LGAs), pin grid arrays (PGAs), plugs (example, male), sockets (example, female), pins, connectors, soldering, or other removable or disconnectable attachments.

A module can include a variety of different heat exchanging or heat transferring interfaces (such as the interface between two thermal dissipation devices or the interface between a thermal dissipation and a PCB or a heat-generating component). These interfaces can be adapted to enhance heat conduction or heat exchange. For example, the interfaces can include conductive resins, tapes, adhesives, gap pads, greases, or any other device or compound that facilitates or improves heat conduction.

Embodiments in accordance with the invention can be utilized in a wide variety of different methods and embodiments. For example, embodiments in accordance with the present invention can utilize embodiments taught in U.S. patent application Ser. No. 10/800,837 filed Mar. 15, 2004, entitled "Multi-Processor Module" and incorporated herein by reference. As another example, an exemplary method can comprise connecting plural heat-generating components to a first circuit board. The heat-generating components can include plural separate processors (example processors formed on separate dies), ASICs, memories, and other devices. A power system can be connected in a vertical stacked-up configuration to the first circuit board. One or more power connectors can couple the power system to the first circuit board. A thermal dissipation device is disposed or above or along one surface of the power system. The thermal dissipation device thermally dissipates heat away from both the first circuit board (including the heat-generating components) and the power system. The thermal dissipation device can simultaneously dissipate heat (for example via a direct heat exchange) from both the first circuit board (including the heat-generating components) and the power system. Additionally, the thermal dissipation device can comprise, utilize, or generate a flow of air in an airflow pathway. The airflow pathway can be directed to any one of or any combination of the first circuit board, the power system, the thermal dissipation device, and/or the heat-generating components. Together, the power system, first circuit board, thermal dissipation device, and heat-generating components form a processor/power module. This module can be connected to a second circuit board (such as a system board or motherboard) and arranged, for example, in a vertically stacked-up configuration. For example, a first half of the processor/power module can connect or couple to one side of the second circuit board, and a second half of the processor/power module can connect or couple to a second side (opposite the first side) of the second circuit board. The processor/power module is removably connectable to the second circuit board. The components with in the processor/power module (such as the thermal dissipation device, the PCB, the processors, the memory, the ASIC, and/or the power system) can be individually or jointly repaired or replaced. The revised power/processor module can then be re-connected to the second circuit board.

One skilled in the art will appreciate that a discussion of various methods should not be construed as steps that must proceed in a particular order. Additional steps may be added, some steps removed, or the order of the steps altered or otherwise changed.

While the invention has been disclosed with respect to a limited number of embodiments, those skilled in the art will appreciate, upon reading this disclosure, numerous modifications and variations. It is intended that the appended claims cover such modifications and variations and fall within the true spirit and scope of the invention.

What is claimed is:

1. An electronic module, comprising:
   a first portion including a first printed circuit board (PCB) having a memory and plural processors; and
   a second portion including a power system and a thermal dissipation device, the thermal dissipation device having plural extensions and the power system having plural pass-thru holes,
   wherein the first portion electrically couples to the second portion to form the electronic module when the plural extensions extend through the plural pass-thru holes of the power system and through plural pass-thru holes of a second PCB disposed between the first and second portions.

2. The electronic module of claim 1 wherein the pass-thru holes of the power system are concentric with the pass-thru holes of the second PCB.

3. The electronic module of claim 1 wherein the thermal dissipation device directly contacts both the processors and the power system for dissipating heat directly from the processors and power system to the thermal dissipation device.

4. The electronic module of claim 1 wherein the thermal dissipation device has a first surface with a surface area that directly contacts a surface of the power system.

5. The electronic module of claim 4 wherein the thermal dissipation device has a second surface that is opposite the first surface, the second surface forming one side of the electronic module.

6. The electronic module of claim 1 wherein:
   the second PCB is sandwiched between the first PCB and the power system;
   the extensions conduct heat from the plural processors and through the pass-thru holes of both the power system and the second PCB.

7. The electronic module of claim 1 wherein the thermal dissipation device conducts heat from the plural processors and through the extensions, and dissipates the heat from an outer surface of the thermal dissipation device.

8. The electronic module of claim 1 comprising three different vertically stacked layers separated from each other, the layers including the first PCB as a first layer, the second PCB as a second and middle layer, and the power system as a third layer.

9. The electronic module of claim 1 wherein the thermal dissipation device substantially fills a volume of space formed above the plural processors and through the pass-thru holes of the power system and the second PCB.

10. A method, comprising:
    connecting a memory and plural separate processors to a first circuit board;
    stacking a second circuit board between a power system board and the first circuit board;
    extending a portion of a thermal dissipation device through pass-thru holes in both the second circuit board and the power system board; and
    dissipating heat away from the power system board and away from the plural separate processors with the thermal dissipation device.

11. The method of claim 10 further comprising passing an airflow through holes in the thermal dissipation device.

12. The method of claim 10 further comprising dissipating heat from the plural separate processors with a direct heat exchange from the plural separate processors to the thermal dissipation device.

13. The method of claim 10 further comprising:
dissipating heat from the power system board with an airflow generated by the thermal dissipation device onto the power system board;
dissipating heat from the plural separate processors with a direct heat exchange from the plural separate processors to the thermal dissipation device.

14. The method of claim 10 further comprising aligning the pass-thru holes in the second circuit board with the pass-thru holes in the power system board so the portion of the thermal dissipation device can pass through both the second circuit board and power system board and contact the plural separate processors of the first circuit board.

15. The method of claim 10 further comprising connecting the first circuit board to the power system board to form an electronic module that is mechanically and electrically connectable to the second circuit board.

16. An electronic assembly, comprising:
a circuit board having plural separate processors;
a power board coupled, to form a vertically stacked-up configuration, to the circuit board for providing power to the circuit board, the power board having at least one opening through the power board;
a system board having at least one opening and disposed between the circuit board and the power board; and
a thermal dissipation device disposed on the power board and having at least one extension extending through the openings in the power and system boards to be on at least one of the processors.

17. The electronic assembly of claim 16 wherein the thermal dissipation device dissipates heat away from the at least one processor and the power board.

18. The electronic assembly of claim 16 wherein the thermal dissipation device dissipates heat, via a direct heat exchange, from both the power board and the plural processors and conducts the heat through the openings in the power and system boards.

19. The electronic assembly of claim 16 wherein the plural separate processors are enclosed in the electronic assembly between one side of the circuit board and one side of the system board.

* * * * *

UNITED STATES PATENT AND TRADEMARK OFFICE
CERTIFICATE OF CORRECTION

PATENT NO. : 7,289,328 B2
APPLICATION NO. : 11/021500
DATED : October 30, 2007
INVENTOR(S) : Christian L. Belady et al.

It is certified that error appears in the above-identified patent and that said Letters Patent is hereby corrected as shown below:

In column 9, line 22, delete "7101B" and insert -- 710B --, therefor.

In column 10, line 35, delete "Intone" and insert -- In one --, therefor.

Signed and Sealed this

Twentieth Day of October, 2009

David J. Kappos
*Director of the United States Patent and Trademark Office*